(12) United States Patent
Watanabe et al.

(10) Patent No.: US 7,951,272 B2
(45) Date of Patent: May 31, 2011

(54) THIN FILM PRODUCING METHOD

(75) Inventors: Yoshiaki Watanabe, Kyotanabe (JP); Takahiko Yanagitani, Kyotanabe (JP)

(73) Assignee: Omron Corporation, Kyoto (JP)

( * ) Notice: Subject to any disclaimer, the term of this patent is extended or adjusted under 35 U.S.C. 154(b) by 537 days.

(21) Appl. No.: 11/662,805

(22) PCT Filed: Sep. 16, 2005

(86) PCT No.: PCT/JP2005/017111
§ 371 (c)(1),
(2), (4) Date: Mar. 14, 2007

(87) PCT Pub. No.: WO2006/030884
PCT Pub. Date: Mar. 23, 2006

(65) Prior Publication Data
US 2008/0118661 A1    May 22, 2008

(30) Foreign Application Priority Data
Sep. 16, 2004   (JP) ................................. 2004-269087

(51) Int. Cl.
*C23C 14/34* (2006.01)
(52) U.S. Cl. .......... 204/192.12; 204/298.15; 204/298.12
(58) Field of Classification Search ............. 204/298.12, 204/298.15, 192.12
See application file for complete search history.

(56) References Cited

U.S. PATENT DOCUMENTS

| | | | |
|---|---|---|---|
| 5,382,345 A * | 1/1995 | Huang et al. | 204/298.27 |
| 6,077,402 A * | 6/2000 | Hong et al. | 204/192.12 |
| 6,106,689 A * | 8/2000 | Matsuyama | 205/333 |
| 6,426,786 B1 * | 7/2002 | Lu et al. | 349/125 |

FOREIGN PATENT DOCUMENTS

| JP | B1 50-23918 | | 8/1975 |
|---|---|---|---|
| JP | 06088218 A | * | 3/1994 |

(Continued)

OTHER PUBLICATIONS

MAchine Translation of JP06088218A to Ogawa. Published Mar. 29, 1994.*

N. Yokokawa et al., "Love-type Surface-Acoustic Waves Propagating in Amorphous iron-boron Films with Multilayer Structure" J. Appl. Phys. vol. 72, No. 2, Jul. 1992, pp. 360-366.

(Continued)

*Primary Examiner* — Nam X Nguyen
*Assistant Examiner* — Jason M Berman
(74) *Attorney, Agent, or Firm* — Oliff & Berridge, PLC (57) ABSTRACT

The present invention is made to provide a method of producing a ZnO thin film in which the c-axis is oriented in-plane over a large area. A ZnO target 28 as the material of the thin film is sputtered by using a magnetron sputtering system, and a flow of material (material flow) directed from the cathode 23 to the anode 24 is generated in a plasma. The material flow has a high density at its central part and has a low density as it departs from the central part. A substrate 20 is fixed at a position displaced from the central axis of a region 30 where the material flow is generated so as to be inclined relative to the central axis. Thereby, a temperature gradient is naturally formed on the substrate 20, and the c-axis of the ZnO thin film deposited on the substrate 20 is oriented in-plane to the temperature gradient direction. Since the substrate 20 is fixed so as to be inclined relative to the material flow, the area where the c-axis is consistently oriented in-plane becomes larger than before.

6 Claims, 4 Drawing Sheets

FOREIGN PATENT DOCUMENTS

| | | |
|---|---|---|
| JP | A 8-078333 | 3/1996 |
| JP | A 8-228398 | 9/1996 |
| JP | A 2004-156057 | 6/2004 |
| JP | A 2004-244716 | 9/2004 |
| JP | B1 3561745 | 9/2004 |

OTHER PUBLICATIONS

T. Yanagitani et al., "Charaterization of (1120) Textured ZnO Films Fabricated by RF Magnetron Sputtering", Japanese Journal of Applied Physics, vol. 43, No. 5B, 2004, 3004-3007.

* cited by examiner

THIN FILM PRODUCING METHOD

TECHNICAL FIELD

The present invention relates to a method of producing a single-crystal thin film or a polycrystalline thin film oriented to a predetermined direction. The present invention is suitable particularly for the production of a zinc oxide (ZnO) thin film.

BACKGROUND ART

To improve the performance of measuring instruments in an ultrasonic measurement, a transducer with a high resolution has been demanded. A transducer is a device for generating or detecting a surface acoustic wave or a bulk acoustic wave. A measurement transducer is used mainly for measurement of material constants, detection of a defect or flaw in an object medium, measurement of stress, and so on. Generally, a piezoelectric substance using the piezoelectric effect which is a phenomenon that the polarization changes by receiving strain due to a sound wave is used as the transducer. The spatial resolution of a measurement system is inversely proportional to the sonic velocity and proportional to the operating frequency. Thus, in order to perform the above measurement with a high resolution, it is necessary to (i) use a shear wave having a lower sonic velocity than a longitudinal wave and (ii) perform the wave generation and detection within a higher frequency range. Therefore, a high-frequency shear wave transducer is in high demand in the measurement field.

As mobile communication equipments such as a mobile phone are downsized, signal processing devices used in the equipments have also been demanded to reduce their size. Such devices include a SAW (Surface Acoustic Wave) device. In the SAW device, a Rayleigh wave which is a combined wave of a longitudinal wave and a transverse wave propagating on a piezoelectric material film was conventionally used. Since the Rayleigh wave attenuates when it is reflected on an end surface of the piezoelectric material film, it has been conventionally necessary to provide a reflector to prevent the attenuation. On the other hand, a shear-horizontal type SAW (SH-SAW) device has been used in recent years, where the shear-horizontal type SAW device is a SAW device utilizing the shear-horizontal type SAW consisted solely of the shear wave vibrating in parallel to the piezoelectric film. Since the shear-horizontal type SAW is totally reflected on an end surface of the piezoelectric film, the reflector need not be provided in the shear-horizontal type SAW device, as conventional ones. which enables the downsizing.

The above transducer and shear-horizontal type SAW operate in a high frequency range of several hundred MHz to several GHz. In the piezoelectric substance of these devices, the relation $v=V/(2d)$ holds among the frequency $v$ ($sec^{-1}$), sonic velocity V (m/s), and thickness of the piezoelectric body d (m). Given that the sonic velocity of the shear wave propagating through the piezoelectric body is 3000 m/s to 8000 m/s, in order for the devices to operate within such a high frequency range, the thickness d of the piezoelectric body needs to be several μm to several tens of μm. Piezoelectric material that can be made to have such a thickness includes ZnO, $Pb(Zr,Ti)O_3$ (which is abbreviated as PZT), and polyvinylidene fluoride-trifluoroethylene (P(VDF-TrFE)).

To generate a shear wave, the piezoelectric substance must vibrate in the slide (or shear) mode, and the polarization axis must be vertically oriented in relation to the direction of the electric field. Thus, for the thin films made of PZT or P(VDF-TrFE), polarization processing must be performed by applying a strong electric field (exceeding 50 MV/m) in an in-plane direction. However, it is difficult to perform such processing over a region of several mm or more. On the other hand, for a ZnO thin film, such a polarization processing is not necessary, but the shear wave can be generated by aligning the crystalline orientation. For example, when the c-axis is oriented to one direction in the plane of the thin film, a shear wave is generated by placing the thin film between electrodes to make the c-axis perpendicular to the direction of the electric field. Thus, it is desirable that the ZnO thin film oriented to one in-plane direction (hereinafter referred to as "c-axis in-plane oriented ZnO thin film") is used as the piezoelectric film used in the above transducer and shear-horizontal type SAW.

When the ZnO thin film is epitaxially grown on a sapphire single crystal substrate whose surface is set to be the (01-12) plane, the c-axis can be oriented to one in-plane direction. However, when a shear wave transducer is to be produced using the ZnO thin film, the ZnO thin film must be adhered through an adhesive layer to an electrode formed on a surface of an object medium in which the transverse wave propagates. The existence of the adhesive layer lowers the efficiency of converting the vibration of the ZnO thin film to the shear wave which propagates through the object medium. In addition, the sapphire single crystal substrate is expensive and disadvantageous in terms of costs. Furthermore, since the type of the substrates is limited, the characteristics of the device to which the transducer is applied may be restricted.

Thus, it is studied that the c-axis in-plane oriented ZnO thin film is directly formed on the electrode. Patent Document 1 describes that when a ZnO thin film doped with aluminum or aluminum oxide is formed on an aluminum electrode, its c-axis lies in the plane. However, according to this method, aluminum or aluminum oxide is necessarily contained as impurities in the ZnO thin film. Patent Document 2 describes that a low-resistivity ZnO thin film is epitaxially grown on a sapphire (01-12) single crystal substrate as an electrode, and then a high-resistivity ZnO thin film is grown on the epitaxially-grown film as the piezoelectric body. However, in this method, since the electric resistivity of the electrode (low-resistivity ZnO thin film) is higher than that of metal, it is difficult to be applied to various electric devices.

On the contrary, the present inventors found that the c-axis in-plane oriented ZnO thin film can be obtained by depositing the material of the thin film on the substrate endowed with a temperature gradient (Patent Document 3). According to this method, the c-axis in-plane oriented ZnO thin film can be directly formed on a metal substrate (electrode) without doping impurities. For this reason, the c-axis in-plane oriented ZnO thin film obtained according to this method can be suitably used for devices such as transducers and surface SH wave devices.

Furthermore, according to this method, the c-axis in-plane oriented ZnO thin film can be produced on various substrates such as a glass substrate or a ceramic substrate as well as the metal substrate. In addition, this method can be applied not only to the c-axis in-plane oriented ZnO thin film, but also to a thin film having a predetermined crystal axis oriented to a predetermined direction.

Figure 1:
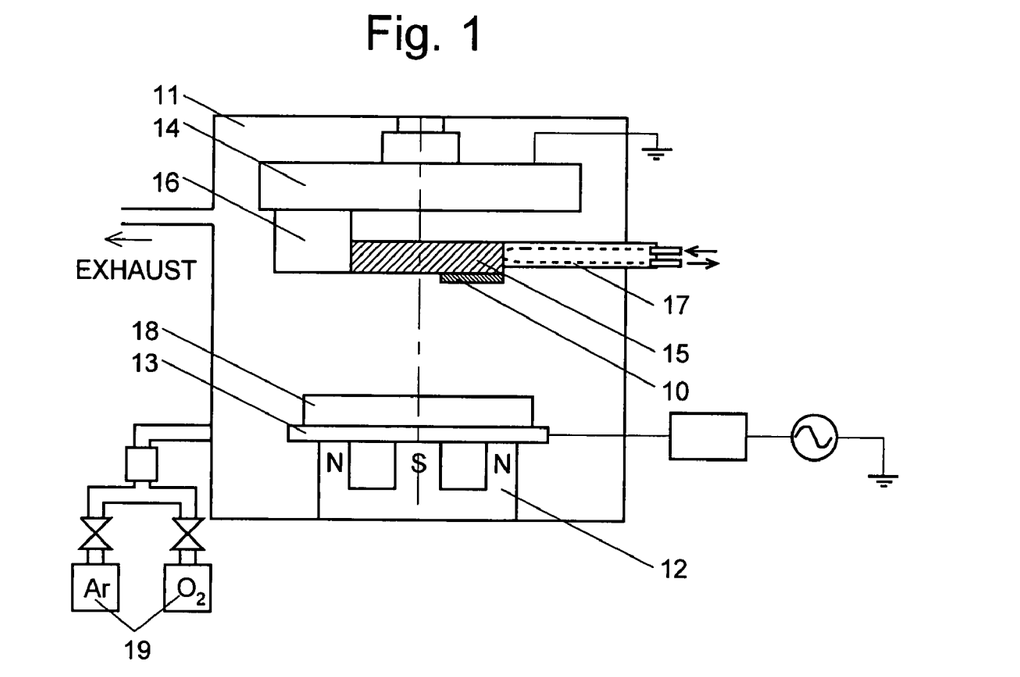
FIG. 1 is a sectional view of a conventional thin film producing apparatus.

Patent Document 3 uses a magnetron sputtering device for depositing the material (ZnO) of the thin film on a substrate. FIG. 1 shows an example of a thin film producing apparatus using the magnetron sputtering device. A magnetron circuit 12 and a cathode 13 are provided in a lower portion of a film formation chamber 11, and an anode 14 is provided in the upper portion. A substrate 10 is placed on a substrate base 15 just below the an anode 14 so as to be substantially parallel to the cathode 13 and the anode 14. A temperature gradient in the direction parallel to the substrate 10 is formed in the substrate 10 with a heater 16 and a water cooler 17 which are provided at the substrate base 15. An additional temperature gradient is endowed to the substrate 10 because of the temperature gradient naturally formed in the film formation chamber 11 by placing the substrate 10 at a position displaced from the center (the chain line in the drawing) of the magnetron circuit 12, the cathode 13 and the anode 14. A target 18 as the material of the thin film is placed on an upper surface of the cathode 13. The magnetron circuit 12 is placed under the cathode 13. The film formation chamber 11 is connected to a gas source 19 of argon (Ar) gas and oxygen ($O_2$) gas.

Operations of this apparatus are described. The Ar gas and $O_2$ gas are introduced into the film formation chamber 11, and a radio frequency electric power is supplied to the cathode 13. A magnetic field and an electric filed are formed in the film formation chamber 11, and the Ar gas and $O_2$ gas are ionized by the electric field to release electrons. The electrons move along troidal curves in the magneto-electric field near the target 18. Thereby, plasma is generated in the vicinity of the target 18 to sputter the target 18. The sputtered material forms a unidirectional flow (material flow) directed to the anode 14 in the plasma. The material flow reaches the surface of the substrate 10 and the sputtered material is deposited on the surface. At this time, the c-axis of ZnO is oriented in the direction parallel to the substrate due to the above temperature gradient.

[Patent Document 1] Examined Japanese Patent Publication No. S50-23918 (the left column, line 36 of page 1 to the left column, line 2 of page 2)

[Patent Document 2] Unexamined Japanese Patent Publication No. H8-228398 ([0017] to [0025])

[Patent Document 3] Examined Japanese Patent Publication No. 3561745 ([0020] to [0031], and FIG. 3)

DISCLOSURE OF THE INVENTION

Problems to be Solved by the Invention

In order to mass-produce the above described device, it is desirable that the area of the produced c-axis in-plane oriented ZnO thin film is large. Of course, this also applies to other thin films. In this connection, there is yet room for improvement in the conventional thin film producing method. An object of the present invention is to provide a method of producing a c-axis in-plane oriented ZnO thin film having a larger area than conventional ones, and other thin films with its predetermined crystal axis oriented in a predetermined direction.

Means for Solving the Problems

The thin film producing method of the present invention achieved to solve the above problems is characterized by: forming a unidirectional flow of material of a thin film in a plasma, where the material flow has a density gradient in the direction perpendicular to the direction of the material flow; and arranging a substrate in the material flow in an inclined manner so that a part of the substrate on a high-density side is on an upstream side of the material flow, and a part of the substrate on a low-density side is on a downstream side of the material flow.

The thin film producing method according to the present invention can be suitably used for the production of a zinc oxide thin film. That is, the zinc oxide thin film producing method of the present invention is characterized by: forming a unidirectional flow of material of a thin film of zinc oxide in a plasma, where the material flow has a density gradient in the direction perpendicular to the direction of the material flow; and arranging a substrate in the material flow in an inclined manner so that a part of the substrate on a high-density side is on an upstream side of the material flow, and a part of the substrate on a low-density side is on a downstream side of the material flow.

In the present patent application, "material flow" refers to a flow of material of the thin film in one direction formed in the plasma.

EXPLANATION OF NUMERALS 10, 20, 31a, 31b, 31c . . . Substrate
11, 21 . . . Film formation chamber
12, 22 . . . Magnetron circuit
13, 23 . . . Cathode
14, 24 . . . Anode
15, 25 . . . Substrate base
16, 26 . . . Heater
17, 27 . . . Water cooler
18, 28 . . . Target
19, 29 . . . Gas source
32 . . . Material flow
41 . . . Thin film
42 . . . Incident light
43 . . . X-ray detector

MODES FOR CARRYING OUT THE INVENTION AND ITS EFFECT

According to a thin film producing method of the present invention, a unidirectional flow of the material of a thin film (material flow) is formed, where the material flow is in a plasma state or electrically neutral, and it is formed that the material flow has a density gradient in the plasma in the direction perpendicular to the direction of the flow. Such a material flow can be created by a sputtering device such as the above described magnetron sputtering system. When a material flow is created in such system, in many cases, a density distribution is formed in the material flow. By utilizing the temperature gradient generated by the density distribution, the method according to the present invention can be performed.

A substrate is placed in the plasma so as to be inclined with respect to the material flow. Here, the inclination of the substrate is set so that a part of the substrate on the side of the higher density of the material flow is on the upstream side of the material flow, and another part of the substrate on the side of the lower density of the material flow is on the downstream side of the material flow.

By setting the substrate in this manner, a temperature gradient of higher temperature on the higher density side (upstream side) and lower temperature on the lower density side (downstream side) is naturally generated. Thereby, as described above, a thin film having a predetermined crystal axis oriented to the direction of the temperature gradient is formed (deposited) on the substrate.

According to the present invention, by thus arranging the substrate in an inclined manner, the crystal axis can be oriented more than the case where the substrate is placed perpendicular to the material flow. As a result, the predetermined crystal axis is consistently oriented to the predetermined direction in a large area of the thin film. When the thin film having such a large area in which the crystal axis is consistently oriented is obtained, the production efficiency of the thin film is enhanced.

Here, "consistently oriented" means that variation in the orientation of the crystal axis is within a predetermined level. One of the criteria is the width of a profile curve obtained through an X-ray diffraction measurement of a thin film where the angle ω between the incident light and the thin film is changed with the angle 2θ between the incident light and the reflected light is fixed. When the width is small, the variation in the orientation of the crystal axis is small. When the value is within the predetermined level, the crystal axis is called consistently oriented.

The reason why the area where the predetermined crystal axis is consistently oriented to the predetermined direction according to the method of the present invention is large has not been identified yet, but there is the following possibility. By arranging the substrate inclined with respect to the material flow, the incident angle of the material flow to the surface of the substrate is decreased. As a result, the orientation of the crystal axis tends to follow the direction of the material flow on the surface of the substrate.

When the material flow is formed using a normal magnetron sputtering system or the like, in many cases, the material flow has a higher density in its central part and has a lower density toward the periphery. On the other hand, as to the direction of the material flow, the component perpendicular to the plane of the anode is large at the center of the anode, and the component parallel to the plane of the anode becomes larger toward the periphery or away from the center of the anode. The parallel component is assumed to contribute to the consistent orientation. When the substrate is arranged in the material flow in an inclined manner according to the method of the present invention, the incident angle of the material flow is smaller in the case where it is placed in the peripheral part than in the central part. That is, the parallel component can be made larger over the whole surface of the substrate.

According to the method of the present invention, as described above, the temperature gradient is naturally formed in the substrate. A larger temperature gradient may be generated by additionally providing a heating means and/or a cooling means (for example, by heating a part of the substrate with a heater or the like or cooling a part of the substrate with cooling water or the like).

The thin film producing method of the present invention can be suitably applied to a production of a c-axis in-plane oriented ZnO thin film. In this case, according to the producing method, ZnO is simply used for the material for the thin film, and the other steps are the same as described above. Thus, the c-axis in-plane oriented ZnO thin film can be obtained. The c-axis in-plane oriented ZnO thin film thus obtained can be suitably used for shear wave transducers and shear-horizontal type SAW devices. Since thin films having large consistently-oriented area as described above can be obtained, production efficiency of the c-axis in-plane oriented ZnO thin film and devices using such a thin film is improved.

According to the present invention, various substrates such as ceramic substrates, glass substrates, and other amorphous substrates as well as metal substrates including copper substrates and aluminum substrates can be employed. Composite substrates such as a metal film deposition substrate obtained by depositing a metal film on a surface of a ceramic substrate, glass plate or the like can be also employed. Among of all, a c-axis in-plane oriented ZnO thin film formed on a metal substrate or a metal film deposition substrate is suited for such shear wave transducers and shear-horizontal type SAW devices that use the substrates as the electrodes. Furthermore, by forming the c-axis in-plane oriented ZnO thin film on a single crystal substrate such as sapphire, a highly crystalline, high-quality single crystal thin film can be obtained.

EMBODIMENTS

Figure 2:
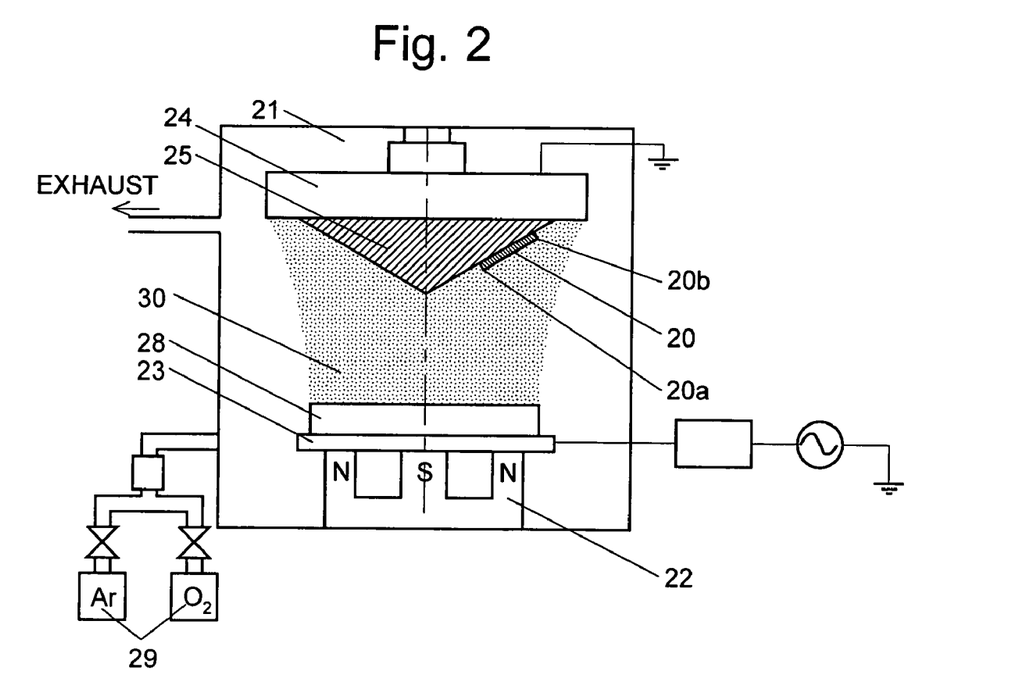
FIG. 2 is a sectional view of a thin film producing apparatus for performing the thin film producing method of the present invention.

A ZnO thin film producing method as an embodiment of the present invention is described referring to FIG. 2. FIG. 2 is a sectional view of a thin film producing apparatus for performing the ZnO thin film producing method of the present invention. Similar to the conventional thin film producing apparatus (FIG. 1), this apparatus generates plasma by magnetron sputtering and sputters a target as the material for the thin film to be deposited on the substrate. A film formation chamber 21, a magnetron circuit 22, a cathode 23, a anode 24, a target 28 and a gas source 29 are the same as those in FIG. 1. In producing the ZnO thin film, a sintered ZnO is used as the target 28.

In the thin film producing apparatus of the present embodiment, the surface of a substrate base 25 is fixed at a position displaced from the line connecting the centers of the magnetron circuit 22, the cathode 23 and the anode 24 (the chain line in the drawing), and set to be inclined to the line. Since the substrate 20 is placed on the surface of the substrate base 25, the substrate 20 is also arranged so as to be inclined to the center line. The inclination is set so that the distance between an end 20a closer to the center line and the cathode 23 is smaller than the distance between the other end 20b farther from the center line and the cathode 23.

No heater and water cooler for creating a temperature gradient in the substrate is provided in the thin film producing apparatus in the present embodiment.

A method for producing a ZnO thin film using the thin film producing apparatus is described. As in the conventional thin film producing apparatus (FIG. 1), Ar gas and $O_2$ gas are introduced into the film formation chamber 21 and a radio-frequency (RF) power is supplied to the cathode 23, thereby generating plasma in the vicinity of the target 28 to sputter the target 28. The sputtered ZnO together with the oxygen plasma form a unidirectional flow (material flow) toward the anode 24 due to the voltage between the cathode 23 and the anode 24. The density of the material flow becomes smaller as it departs from the center of the anode 24, and ceases at a certain distance and farther. That is, the material flow exists only in a columnar region 30 around the center line. At a position adequately away from the target 28 toward the anode 24, the density of the material flow is highest at the central axis and becomes lower as it departs from the center line.

The material flow reaches the surface of the substrate 20, and ZnO is deposited on the surface. Since the substrate 20 is placed at the position displaced from the center line, the temperature gradient in which the temperature is lower at the end 20b than at the other end 20a is formed on the substrate 20. Thus, the c-axis of ZnO is oriented in parallel to the substrate.

Figure 3:
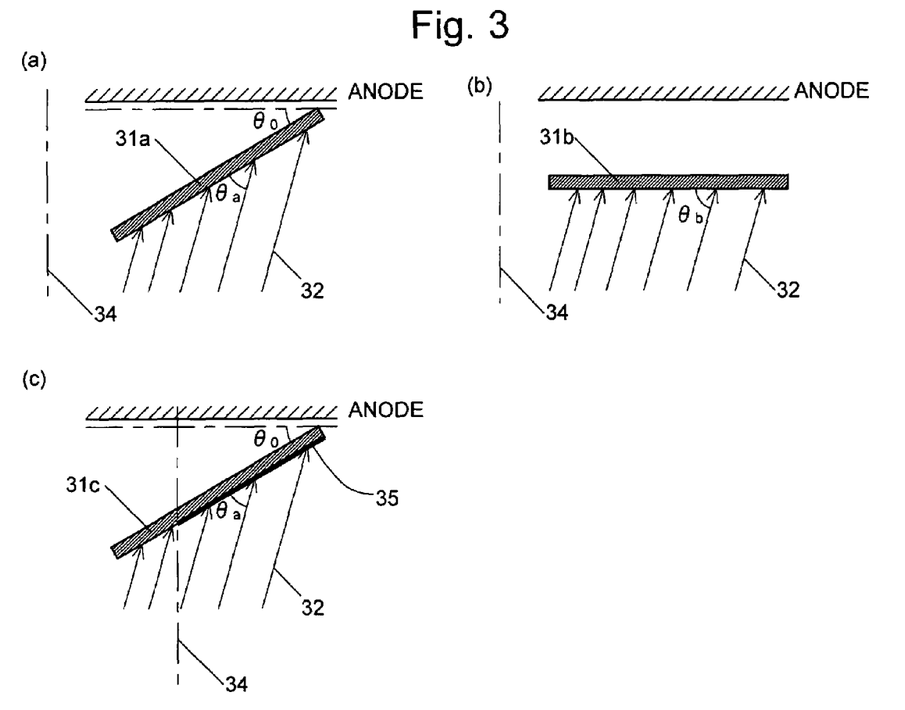
FIG. 3 is a view showing an arrangement of a substrate and an incidence angle of the material flow relative to the substrate in the present embodiment (a) and a comparative example (b).

As shown in FIG. 3(a), the incident angle θa of the material flow 32 with respect to the substrate 31a in the present embodiment is smaller than the incident angle θb of the material flow 32 with respect to the substrate 31b in FIG. 1 (FIG. 3(b)). Thus, compared to the case of using the apparatus shown in FIG. 1, the area where the c-axis is consistently oriented in the ZnO thin film formed on the substrate becomes larger in the present embodiment.

FIG. 3(a) shows the case where the substrate 31a does not intersect the center line 34. However, even when the substrate 31c is arranged at the position including the center line 34 as shown in FIG. 3(c), the region 35 in the substrate 31c that departs from the upstream side of the material flow 32 as it becomes away from the center line 34 satisfies the condition of substrate arrangement of the present invention.

When the discharge pressure is high, the mean free path becomes short and particles having a high reactivity cannot adequately reach the substrate. For this reason, for example, given that the distance between the substrate and the target is 60 mm, it is desirable that the pressure of the gas introduced into the film formation chamber 21 is $6 \times 10^{-3}$ Torr or smaller.

For each of the case where the angle $\theta_0$ between the anode and the substrate is 30° (present embodiment) and the case where the angle $\theta_0$ is 0° (i.e., the substrate is arranged in parallel to the anode plane) (comparative example), a sample was prepared and evaluated. The sample was produced by using the apparatus shown in FIG. 2. In this apparatus, the radius of the magnetron circuit 22 was 35 mm, the radius of the cathode 23 and the anode 24 was 51 mm and the distance between the target 28 and the anode 24 was 60 mm. The substrate used was a metal film deposition substrate formed by depositing aluminum on a Pyrex (registered trademark) glass substrate. The substrate was 50 mm in length, 25 mm in width and 1 mm in thickness. An end 20a in the longitudinal direction was located on the center line and at the position displaced from the anode 24 toward the cathode 23 by 25 mm. After arranging the substrate in this manner and performing the magnetron sputtering, the temperature gradient was formed in the substrate in the longitudinal direction. The pressure ratio of the mixture of Ar gas and $O_2$ gas was 1:3, and the pressure of the mixed gas was $7 \times 10^{-4}$ Torr. The power supplied to the cathode 23 was 60 W and sputtering was performed for 20 hours.

Figure 4:
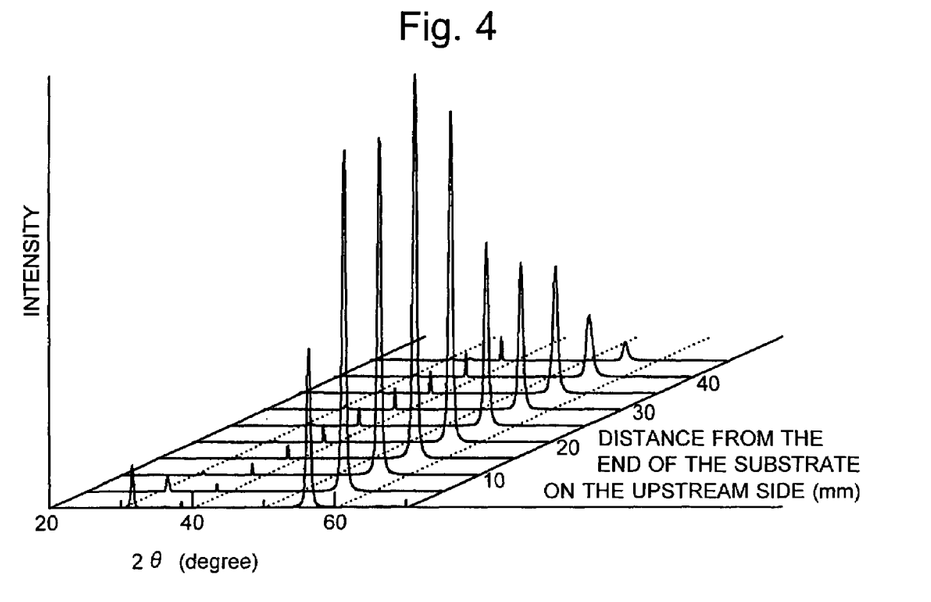
FIG. 4 is a chart of the 2θ/ω-scanning X-ray diffraction patterns in the present embodiment.
Figure 5:
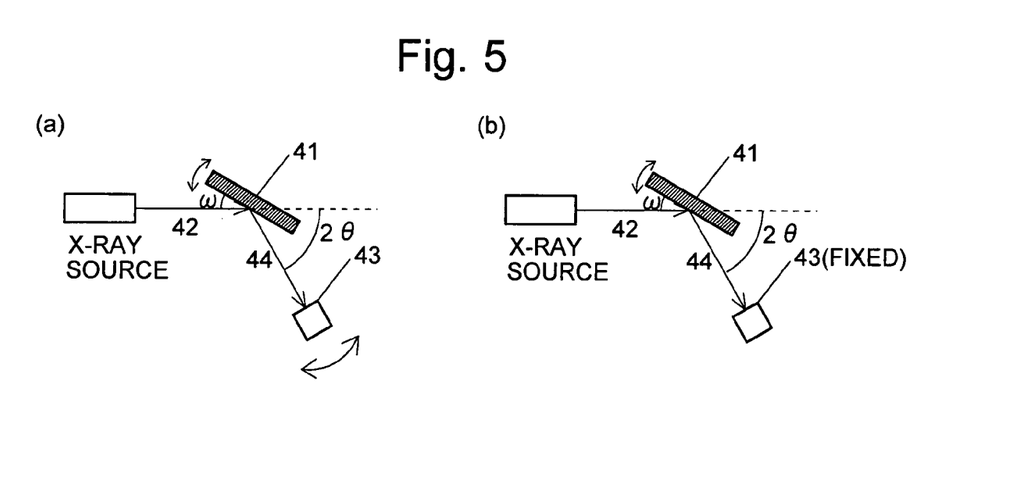
FIG. 5 is a view for describing 2θ/ω-scanning X-ray diffraction measurement (a) and ω-scanning X-ray diffraction measurement (b).

When a 2θ/ω-scanning X-ray diffraction measurement was performed for each of thin films of the present embodiment and the comparative example, a chart showing that a sharp peak appears in the vicinity of 2θ=56° for both thin films. FIG. 4 is the chart of 2θ/ω-scanning X-ray diffraction patterns on the present embodiment. The chart shows measurement results at a plurality of points of different distances from the end at the center line (the end on the upstream side) of the substrate. The peak found in the vicinity of 2θ=38° is due to the aluminum electrode layer of the substrate. The results of this 2θ/ω-scanning X-ray diffraction patterns reveal that the (11-20) plane of ZnO is rendered in parallel to the substrate in both the thin films of the present embodiment and of the comparative example, that is, c-axis is oriented in-plane. In the 2θ/ω-scanning X-ray diffraction measurement, as shown in FIG. 5(a), both the angle 2θ and the angle ω are scanned, where the angle 2θ is the angle between the X-ray incident light 42 incident on the surface of the thin film 41 and the line 44 connecting the incident point of the incident light to the X-ray detector 43, and the angle ω is the angle between the incident light 42 and the surface of the thin film 41.

Figure 6:
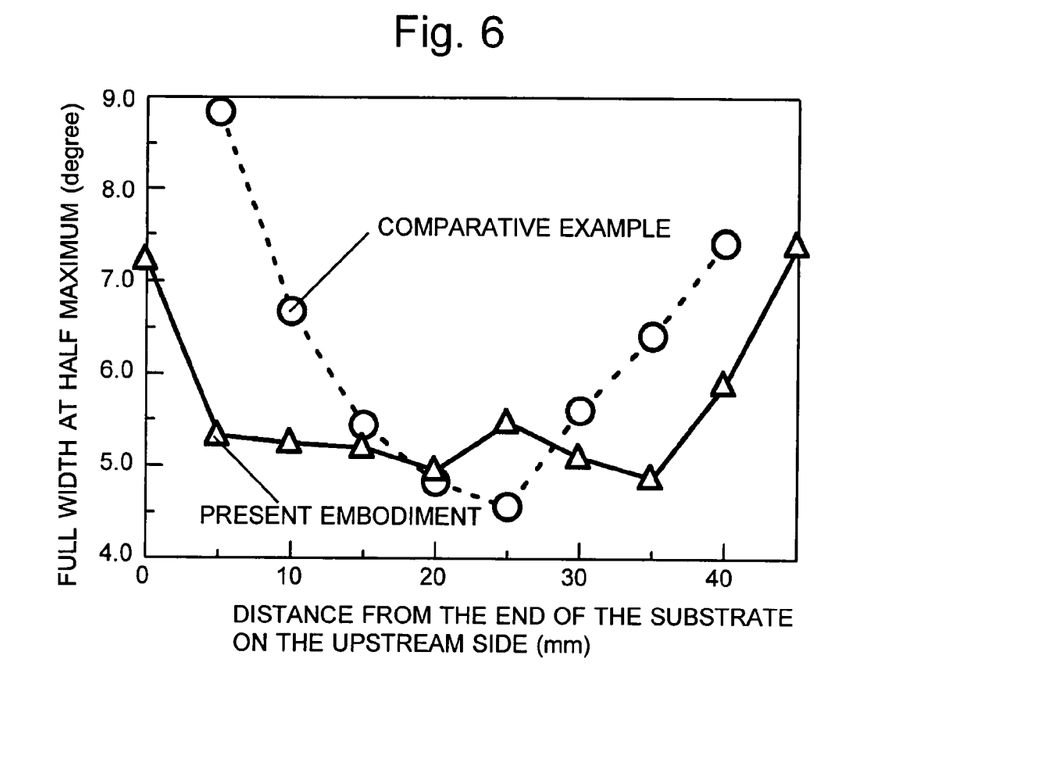
FIG. 6 is a graph of the FWHM (full width at half maximum) of the peaks obtained through the ω-scanning X-ray diffraction rocking curve of the present embodiment and the comparative example.

Next, the ω-scanning X-ray diffraction rocking curve measurements are performed on the thin films of the present embodiment and the comparative example. As shown in FIG. 5(b), in the ω-scanning X-ray diffraction rocking curve measurement, only ω is scanned while the angle 2θ is fixed. As variation in the orientation of the crystal axis of a sample is larger, the width of peaks appearing in the chart is larger. In the present embodiment, the ω-scanning X-ray diffraction rocking curve measurement was performed with the angle 2θ fixed to the value of 2θ for the (11-20) peak obtained by the above described 2θ/ω-scanning X-ray diffraction measurement, and the full width at half maximum of the obtained curves was determined. The values are shown in FIG. 6. The abscissa is the distance from the upstream end of the substrate. According to FIG. 6, in the present embodiment, the full width at half maximum was limited to 5.5° or less over the range of distance from the upstream end from 5 to 35 mm. If the full width at half maximum is limited to 5.5° or less, it can be said that the c-axis is adequately oriented to be used in devices such as transducers. This range is larger than the range in which the full width at half maximum is 5.5° or less in the comparative example (where the distance from the upstream end is 15 to 30 mm). Therefore, according to the method of the present embodiment, the c-axis in-plane oriented ZnO thin film of a larger area than the comparative example can be obtained, so that it can be used for the devices such as transducers.

Figure 7:
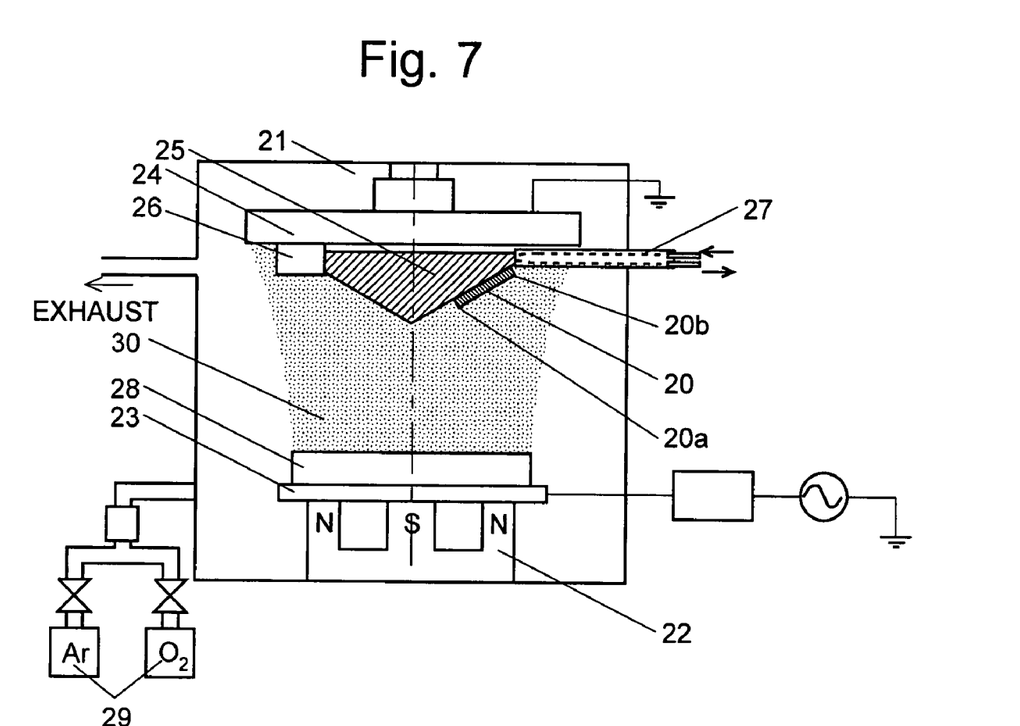
FIG. 7 is a sectional view showing another example of the thin film producing apparatus for performing the ZnO thin film producing method of the present invention.

FIG. 7 shows another example of the thin film producing apparatus for performing the ZnO thin film producing method of the present invention. Similar to the apparatus shown in FIG. 2, the substrate 20 is fixed at a position displaced from a line connecting the centers of the magnetron circuit 22, the cathode 23 and the anode 24 (the chain line in the drawing), and set to have an angle with respect to the line. Configuration of the film formation chamber 21, the magnetron circuit 22, the cathode 23, the anode 24, the target 28 and the gas source 29 is the same as that in the apparatus shown in FIG. 2. In the present embodiment, a heater 26 is provided in the substrate base 25 on the side of an end 20a of the substrate, and a water cooler 27 is provided on the side of the other end 20b of the substrate. Operations of this thin film producing apparatus is the same as those of the apparatus shown in FIG. 2 except that a temperature gradient is added to the substrate 20 by the heater 26 and the cooler 27. With such configuration, the heater 26 and the water cooler 27 increases the temperature gradient naturally formed due to the density distribution of the material flow This configuration is especially effective in the case where the c-axis of the ZnO thin film is not sufficiently oriented in-plane solely by the naturally-formed temperature gradient.

The invention claimed is:

1. A method of producing a thin film on a substrate comprising:
    forming a unidirectional flow of material of the thin film in a plasma within a physical vapor deposition chamber, where the flow of material has a density gradient in a direction perpendicular to a flow direction of the flow of material; and placing an entirety of the substrate in the flow of material in an inclined manner so that a part of the substrate on a side of a higher density is on an upstream side of the flow of material, and a part of the substrate on a side of a lower density is on a downstream side of the flow of material, wherein the entirety of the substrate is offset with respect to a centerline extending between a center of a target and a center of a substrate base of the physical vapor deposition chamber, such that the centerline does not intersect the substrate, wherein the thin film is formed on the substrate.

2. A method of producing a thin film on a substrate comprising:

forming a unidirectional material flow of zinc oxide in a plasma within a physical vapor deposition chamber, where the flow of material has a density gradient in a direction perpendicular to a flow direction of the flow of material; and placing an entirety of the substrate in the flow of material in an inclined manner so that a part of the substrate on a side of a higher density is on an upstream side of the flow of material, and a part of the substrate on a side of a lower density is on a downstream side of the flow of material, wherein the entirety of the substrate is offset with respect to a centerline extending between a center of a target and a center of a substrate base of the physical vapor deposition chamber, such that the centerline does not intersect the substrate, wherein the thin film is formed on the substrate.

3. The thin film producing method according to claim 1, wherein the substrate is endowed with a temperature gradient with a heating means and/or a cooling means.

4. The thin film producing method according to claim 1, wherein the flow of material is generated by a magnetron sputtering system.

5. The thin film producing method according to claim 1, wherein the substrate is a metal substrate or a substrate having a metal deposited surface.

6. The thin film producing method according to claim 1, wherein the substrate is a single crystal substrate.

* * * * *